US009652013B2

(12) United States Patent
Muggler et al.

(10) Patent No.: US 9,652,013 B2
(45) Date of Patent: May 16, 2017

(54) PIEZO DRIVER HAVING PASSIVE ENERGY STORAGE COMPONENT RECHARGING CAPABILITY

(75) Inventors: Patrick Muggler, Palo Alto, CA (US); Anthony S. Doy, Los Gatos, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 524 days.

(21) Appl. No.: 13/609,536

(22) Filed: Sep. 11, 2012

(65) Prior Publication Data

US 2014/0070665 A1    Mar. 13, 2014

(51) Int. Cl.
*H01L 41/04* (2006.01)
*G06F 1/32* (2006.01)
*G06F 3/01* (2006.01)

(52) U.S. Cl.
CPC ........... *G06F 1/32* (2013.01); *G06F 3/016* (2013.01); *H01L 41/042* (2013.01)

(58) Field of Classification Search
CPC .................................................. H01L 41/042
USPC .................................................. 310/314, 317
See application file for complete search history.

(56) References Cited

U.S. PATENT DOCUMENTS

| | | | | |
|---|---|---|---|---|
| 6,133,714 A | * | 10/2000 | Hoffmann et al. | ........... 320/166 |
| 6,661,285 B1 | * | 12/2003 | Pompei et al. | ............... 330/251 |
| 6,995,496 B1 | * | 2/2006 | Hagood et al. | ............... 310/317 |
| 7,019,436 B2 | * | 3/2006 | Rueger et al. | ........... 310/316.03 |

FOREIGN PATENT DOCUMENTS

CN    1259191 A    7/2000

OTHER PUBLICATIONS

Linear Technology—Piezo Microactuator Driver with Boost Regulator http://cds.linear.com/docs/en/datasheet/3469f.pdf.
Maxim Integrated Products—14VP-P, Class G Ceramic Speaker Driver, Rev. 3; May 2008 http://datasheets.maximintegrated.com/en/ds/MAX9788.pdf.
Texas Instruments—Piezo Haptic Driver with Integrated Boost Converter, Jun. 2011—Revised Nov. 2012—http://www.ti.com/lit/ds/symlink/drv8662.pdf.
Office Action Dated Oct. 9, 2016 for Chinese Application No. 201310409539.8.

* cited by examiner

*Primary Examiner* — Derek Rosenau
(74) *Attorney, Agent, or Firm* — Advent, LLP

(57) ABSTRACT

A piezo driver is described that is configured to furnish electric charge to a piezo component during a first operational state and configured to transfer electric charge from the piezo component to a passive energy storage component during a second operational state. In one or more implementations, the piezo driver includes a passive energy storage component configured to store electric charge. The piezo driver also includes a voltage converter configured to electrically connect between a piezo component and the passive energy storage component. The voltage converter is configured to furnish electric charge from the passive energy storage component to the piezo component during a first state of operation and configured to furnish electric charge from the piezo component to the passive energy storage component during a second state of operation.

16 Claims, 3 Drawing Sheets

PIEZO DRIVER HAVING PASSIVE ENERGY STORAGE COMPONENT RECHARGING CAPABILITY

BACKGROUND

Electronic devices such as smartphones, tablet computers, and so forth, often incorporate touch screen panels for receiving user input. A touch screen panel is a display that can detect the presence, location, or pressure associated with a touch within the display area, such as a finger, hand, stylus, or other pointing device. These touch screen panels may employ piezo components, such as piezoelectric sensors, that are configured to utilize the piezoelectric effect to measure mechanical pressure, acceleration, force, and so forth.

SUMMARY

A piezo driver is described that is configured to furnish electric charge to a piezo component during a first operational state and configured to transfer electric charge from the piezo component to a passive energy storage component during a second operational state. In one or more implementations, the piezo driver includes a passive energy storage component configured to store electric charge. The piezo driver also includes a voltage converter configured to electrically connect between a piezo component and the passive energy storage component. The voltage converter is configured to furnish electric charge from the passive energy storage component to the piezo component during a first state of operation and configured to furnish electric charge from the piezo component to the passive energy storage component during a second state of operation.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Touch screen technology may incorporate piezo components (e.g., piezoelectric sensors) that are configured to generate a vibration in response to an electrical signal to generate haptic and/or audio feedback. For example, piezo drivers are utilized to drive a piezo component during the operation of a mobile computing device. Piezo drivers typically build a voltage across the piezo components by forcing current to the piezo component to build electric charge across the component. In some circumstances, a control module determines that a voltage reduction across the piezo component is necessary. In these circumstances, the piezo drivers dump the stored electric charge to ground. When the piezo component generates haptic and/or audio feedback, the voltage across the piezo component increases and decreases many times, which causes inefficient usage of the electric charge.

Accordingly, a piezo driver is described that is configured to furnish electric charge to a piezo component during a first operational state and configured to transfer electric charge from the piezo component to a passive energy storage component during a second operational state. By transferring some of the electric charge back to the passive energy storage component, the piezo driver conserves some of the electric charge within the driver and leads to a more efficient piezo driver as compared to piezo drivers that transfer the charge to ground. In one or more implementations, the piezo driver includes a passive energy storage component configured to store electric charge. In a specific implementation, the passive energy storage component is a capacitor. The piezo driver also includes a voltage converter configured to electrically connect between a piezo component and the passive energy storage component. In certain implementations, the voltage converter functions as a boost converter and in other implementations the voltage converter functions as a buck converter. The voltage converter is configured to furnish electric charge from the passive energy storage component to the piezo component during a first state of operation and configured to furnish electric charge from the piezo component to the passive energy storage component during a second state of operation. In an implementation, the piezo driver is incorporated into an electronic device that includes a piezo component. In some configurations, the piezo driver of the present disclosure may improve efficiency by at least or greater than twenty percent (20%) as compared to the efficiency of piezo drivers that dump the electric charge to ground.

Example Piezo Drivers

Figure 1A:
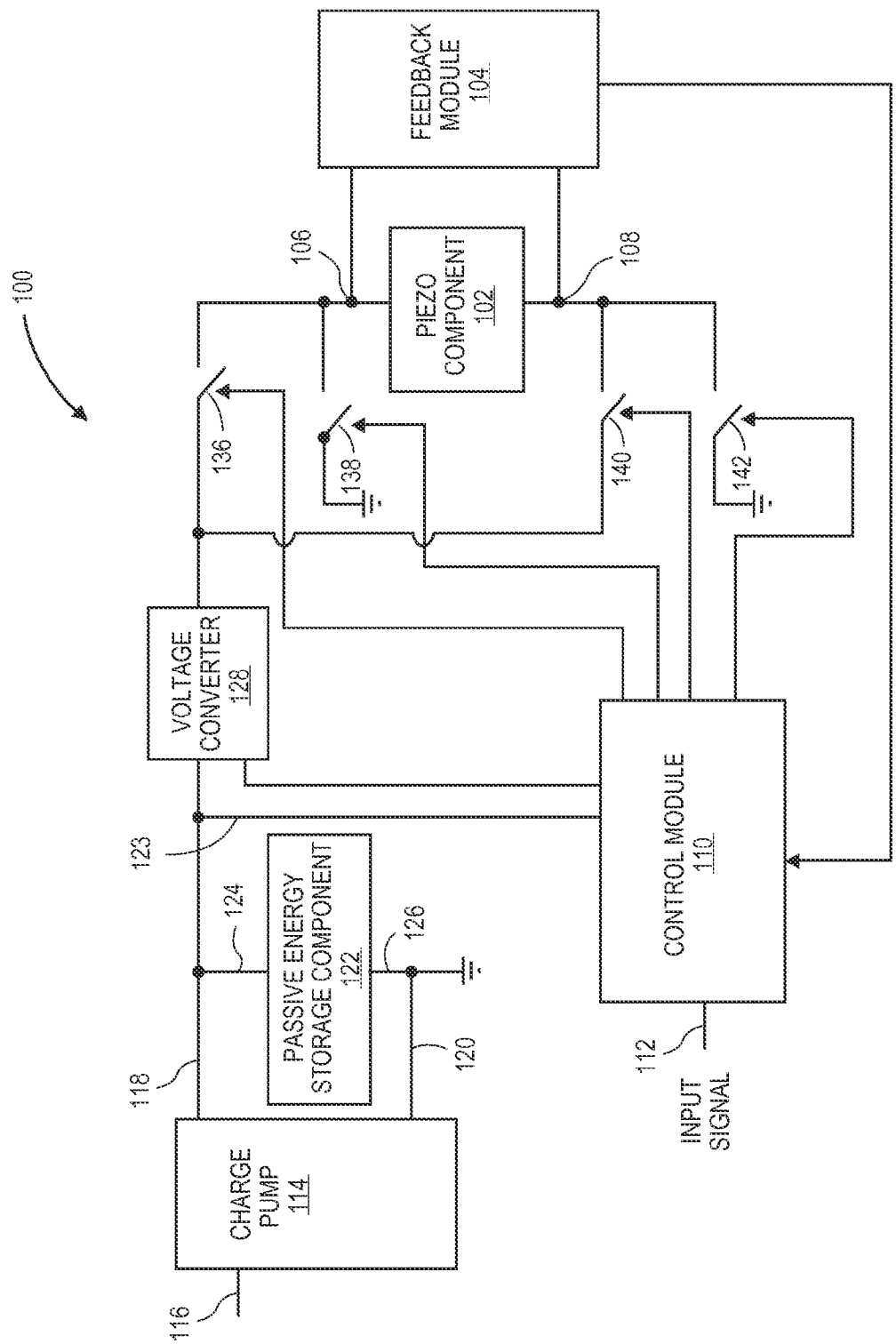
FIG. 1A is a block diagram illustrating a piezo driver in accordance with an example implementation of the present disclosure.
Figure 1B:
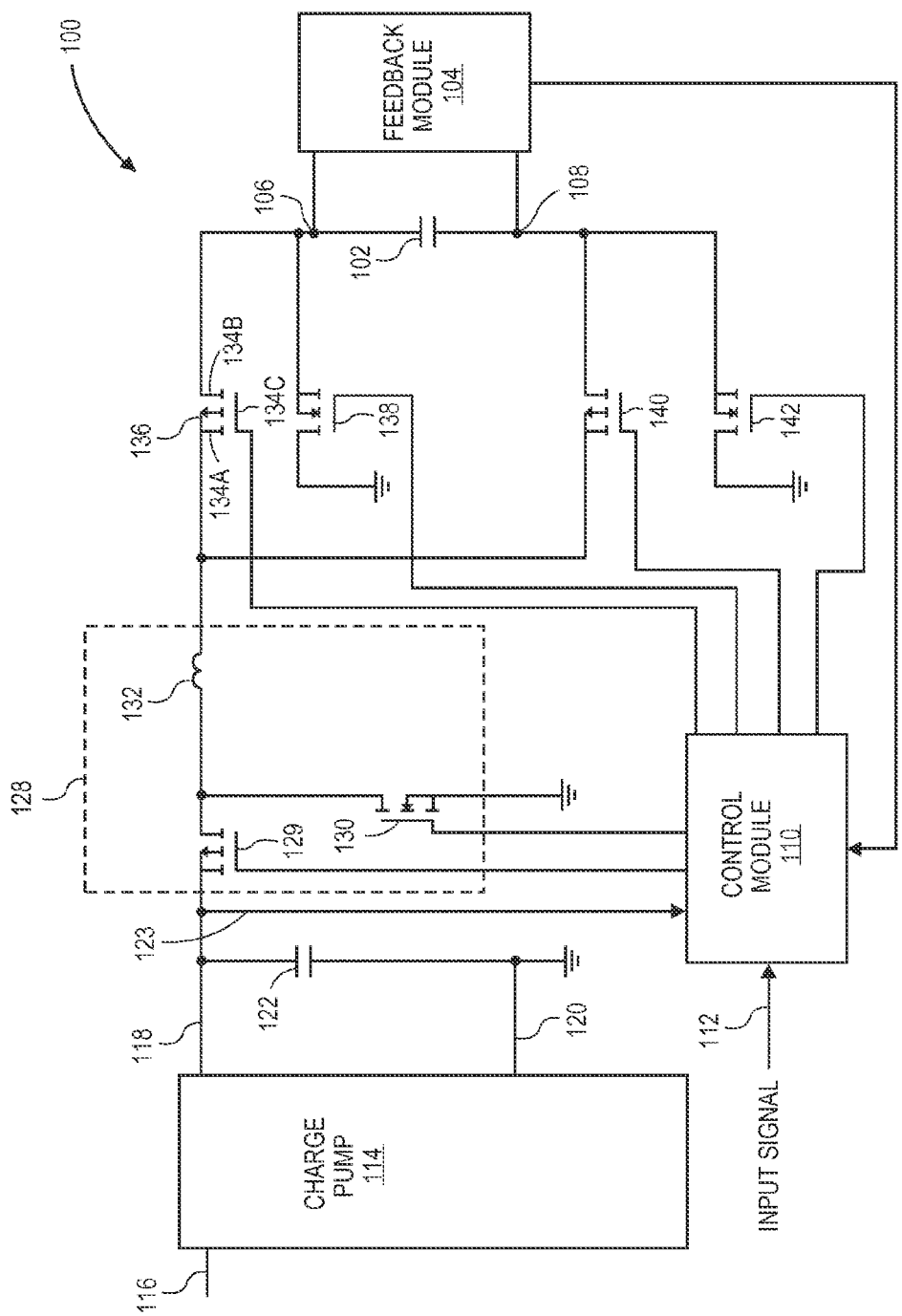
FIG. 1B is a circuit diagram illustrating a piezo driver in accordance with a specific example implementation of the present disclosure.

FIGS. 1A and 1B illustrate a piezo driver 100 in accordance with example implementations of the present disclosure. As shown, the piezo driver 100 is configured to recycle charge within the driver 100. The driver 100 may incorporated into an electronic device that includes a piezo component 102, which may be utilized to generate haptic or audio feedback in electronic devices, such as smartphones, tablet computing devices, laptops, and so forth (e.g., electronic devices having touch screens for receiving user input). In specific implementations, the piezo component 102 may comprise an audio piezo amplifier, a piezo haptic driver, a piezo motor driver, or the like, that is configured to furnish haptic signals, audio signals, combinations thereof, or the like, in response to one or more electrical signals. This functionality may allow the generation of tactile and/or audio feedback (e.g., touch screen of a computing device furnishes tactile feedback and/or audio feedback). In an implementation, the piezo component 102 is manufactured from suitable piezo-electric materials, which may include, but are not limited to serial and bimorph piezo-electric materials.

As shown in FIGS. 1A and 1B, the piezo driver 100 includes a feedback component 104 that is connected across the terminals (e.g., contacts, electrodes) 106, 108 of the piezo component 102 (e.g., feedback component 104 is electrically connected in parallel to the piezo component 102). For convenience purposes, the terminal 106 is referred to as the positive terminal throughout this disclosure, and the terminal 108 is referred to as the negative terminal throughout this disclosure. However, it is understood that the terminal 106 may be the negative terminal and the terminal 108 may be the positive terminal in some configurations of the driver 100. The feedback component 104 is representative of functionality to measure the voltage across the piezo component 102 and furnish a signal representing the measured voltage (i.e., measured voltage signal) to a control module 110. The feedback component 104 may be configured in a variety of ways. For example, the feedback component 104 may be comprised of circuitry (e.g., differential amplifier, etc.), software (e.g., computer-executable instructions), firmware, combinations thereof, or the like, that is configured to measure the voltage across the piezo component 102.

The control module 110 is representative of functionality to determine a desired operational state of the driver 100 and to generate control signals at least partially based upon the measured voltage signal from the feedback component 104 (e.g., based upon the desired operational state). In one or more implementations, the control module 110 is also comprised of circuitry, software, firmware, combinations thereof, or the like. The control module 110 also receives an input signal at the input signal terminal 112, which is electrically connected to the control module 110. The input signal is generated from an external source (e.g., source external to the driver 100), such as an applications sensor, a touch screen, a digital-to-analog converter (e.g., an audio digital-to-analog converter), or the like. The input signal represents a detection of an event, such as a measurement of the input detected by the external source (e.g., a user's touch over the touch screen, a user's input to the applications sensor, etc.). Once the control module 110 receives the input signal, the control module 110 is configured to compare the input signal to the signal representing the measured voltage across the piezo component 102. Based upon the comparison of the input signal and the measured voltage signal, the control module 110 is configured to determine a state of the piezo component 102 (e.g., determine whether to increase the voltage across the piezo component 102 based upon the input furnished to the touch screen, determine whether to increase the voltage across the piezo component 102 based upon the input furnished to the applications sensor, etc.), which is described in greater detail below.

As shown, the piezo driver 100 also includes a charge pump 114 (e.g., a boost converter) that is configured to generate (e.g., furnish, output) an output voltage that is greater than the input voltage. In a specific implementation, the charge pump 114 is a direct current (DC)-to-DC power (boost) converter that converts a source of direct current from one voltage level (e.g., voltage value) to another. For example, the charge pump 114 may be connected to a power source, such as battery of a mobile computing device, by way of a power source connection 116. The charge pump 114 receives an input voltage from the power source and is configured to generate an output voltage greater in value than the input voltage supplied by the power source.

The charge pump 114 includes output terminals 118, 120 that are electrically connected to a passive energy storage component 122. More specifically, the output terminal 118 is connected to the terminal 124 of the passive energy storage component 122, and the output terminal 120 is connected to the terminal 126 of the passive energy storage component 122. The passive energy storage component 122 is configured to store energy (e.g., store electric charge). In a specific implementation, the passive energy storage component 122 is a capacitor (see FIG. 1B). Thus, the charge pump 114 supplies the output voltage, which causes an amount of electric charge to be stored within the passive energy storage component 122 so that the voltage across the component 122 is approximately equal to the output voltage of the charge pump 114. In an implementation, as shown in FIGS. 1A and 1B, the control module 110 is also electrically connected to the passive energy storage component 122 by way of the connection (e.g., contacts, electrodes) 123 for monitoring the voltage across the passive energy storage component 122. For example, if the voltage is too low across the passive energy storage component 122, the control module 110 is configured to cause the charge pump 114 and/or the power source (e.g., power source connected to power source connection 116) to cause the recharging of the passive energy storage component 122.

As shown in FIG. 1A, the piezo driver 100 also includes a voltage converter 128 configured to convert voltage from a first voltage level to a second voltage level, as well as cause the transfer of charge between the piezo component 102 and the passive energy storage component 122. As shown in FIG. 1B, the voltage converter 128 may be configured in an h-bridge topology (i.e., enables voltage to be applied to a load in either direction). In an implementation, the voltage converter 128 comprises transistors 129, 130 and a passive energy component 132 (see FIG. 1B). In an implementation, the transistors 129, 130 are metal-oxide-semiconductor field-effect transistors (MOSFETs), and the passive energy component 132 is an inductor. Thus, the transistors 129, 130 each have an open configuration (e.g., open circuit to prevent current flow) and a closed configuration (e.g., closed circuit to allow current flow). It is contemplated that each transistor described above and herein includes a respective source terminal (e.g., contact) 134A, a drain terminal 134B, and a gate terminal 134C. For simplicity's sake, only one transistor is referenced as including terminals 134A, 134B, 134C; however, it is understood that each of the transistors within the piezo driver 100 include the above-mentioned terminals, as well as respective source/drain regions and gates. Moreover, while these example sources and drain contacts are shown in a specific configuration, it will be appreciated that the source and drain regions of the respective transistor are interchangeable during operation of the piezo driver 100.

The voltage converter 128 is configured to furnish electric charge to (e.g., increase the voltage across) the piezo component 102 (e.g., drive the piezo component 102) by way of the passive energy storage component 122 during a first state of operation and is configured to furnish electric charge to (e.g., increase the voltage across or recharge) the passive energy storage component 122 by way of the piezo component 102 during a second state of operation. As shown in FIG. 1A, the driver 100 further includes switches 136, 138, 140, 142 that are configured to assist in distributing charge during the various states of operation. In a specific implementation, as shown in FIG. 1B, the switches 136, 138, 140, 142 are transistors, such as MOSFET devices, and each has an open configuration and a closed configuration. For example, each of the MOSFET devices described herein may comprise of p-type MOSFET devices and of n-type MOSFET devices. Each of the gate terminals 134C of the respective transistors (switches 136, 138, 140, 142) are electrically connected to the control module 110. Thus, the control module 110 is configured to cause each of the switches 136, 138, 140, 142 to selectively transition from the open configuration to the closed configuration, or vice versa. The switches 136, 138, 140, 142 serve to control the transfer of charge within the piezo driver 100. More specifically, when the switch 136 is in the closed configuration, the positive terminal 106 of the piezo component 102 is electrically connected to voltage converter 128; when the switch 138 is in the closed configuration, the positive terminal 106 of the piezo component 102 is electrically connected to ground potential; when the switch 140 is in the closed configuration, the negative terminal 108 of the piezo component 102 is electrically connected to the voltage converter 128; and when the switch 142 is in the closed configuration, the negative terminal 108 of the piezo component 102 is electrically connected to ground potential (see FIGS. 1A and 1B).

As described above, the control module 110 is configured to determine an operational state of the driver 100 by way of comparing the input signal and the measured voltage signal. For example, based upon the comparison of the input signal and the measured voltage signal, the control module 110 may determine that a positive voltage should be created (e.g., generated) across the piezo component 102 (e.g., a first operational state). In this state, the control module 110 causes switches 136, 142 to be in the closed configuration (e.g., module 110 generates a signal causing the respective transistors to be in the closed configuration) and causes switches 138, 140 to be in the open configuration (e.g., module 110 generates a signal causing the respective transistors to be in the open configuration). The positive terminal 106 is electrically connected to the voltage converter 128 to allow the transfer of charge from the passive energy storage component 122 to the piezo component 102 by way of the voltage converter 128 until a steady state is reached. Thus, the voltage converter 128 is configured to cause the transfer of charge from the passive energy storage component 122 to the piezo component 102. In this state, the voltage converter 128 functions as a buck converter to cause a positive voltage build-up across the piezo component 102 as the negative terminal 108 of the piezo component 102 is electrically connected to ground potential.

The control module 110 may also determine (via the comparison described above) that a positive voltage across the piezo component 102 should be decreased (e.g., a second operational state). In this state, the control module 110 causes switches 136, 142 to be in the closed configuration (e.g., module 110 generates a signal causing the respective transistors to be in the closed configuration) and causes switches 138, 140 to be in the open configuration (e.g., module 110 generates a signal causing the respective transistors to be in the open configuration). The positive terminal 106 is electrically connected to the voltage converter 128 to allow the transfer of charge from the piezo component 102 to passive energy storage component 122 by way of the voltage converter 128 until a steady state is reached (e.g., voltage converter functions as a boost converter). Thus, the voltage converter 128 is configured to cause the transfer of charge from the piezo component 102 to the passive energy storage component 122 Thus, the passive energy storage component 122 may be at least partially recharged (i.e., the charge is recycled) by way of the electric charge from the piezo component 102.

The control module 110 may also determine (via the comparison described above) that a greater negative voltage (i.e., a more negative voltage) across the piezo component 102 should be created (e.g., a third operational state). In this state, the control module 110 causes switches 138, 140 to be in the closed configuration (e.g., module 110 generates a signal causing the respective transistors to be in the closed configuration) and causes switches 136, 142 to be in the open configuration (e.g., module 110 generates a signal causing the respective transistors to be in the open configuration). The negative terminal 108 is electrically connected to the voltage converter 128 to allow the transfer of charge from the passive energy storage component 122 to the piezo component 102 by way of the voltage converter 128 until a steady state is reached. Thus, the voltage converter 128 is configured to cause the transfer of charge from the passive energy storage component 122 to the piezo component 102. In this state, the voltage converter 128 functions as a buck converter to cause a negative voltage build-up across the piezo component 102 as the positive terminal 106 of the piezo component 102 is electrically connected to ground potential (and the negative terminal 108 is electrically connected to the voltage converter 128).

The control module 110 may also determine (via the comparison described above) that a negative voltage across the piezo component 102 should be decreased (e.g., a fourth operational state). In this state, the control module 110 causes switches 138, 140 to be in the closed configuration (e.g., module 110 generates a signal causing the respective transistors to be in the closed configuration) and causes switches 136, 142 to be in the open configuration (e.g., module 110 generates a signal causing the respective transistors to be in the open configuration). The negative terminal 108 is electrically connected to the voltage converter 128 to allow the transfer of charge from the piezo component 102 to passive energy storage component 122 by way of the voltage converter 128 until a steady state is reached (e.g., the voltage converter functions as a boost converter). Thus, the voltage converter 128 is configured to cause the transfer of charge from the piezo component 102 to the passive energy storage component 122. Thus, the passive energy storage component 122 may be at least partially recharged (i.e., the charge is recycled) by way of the electric charge from the piezo component 102.

Example Method

Figure 2:
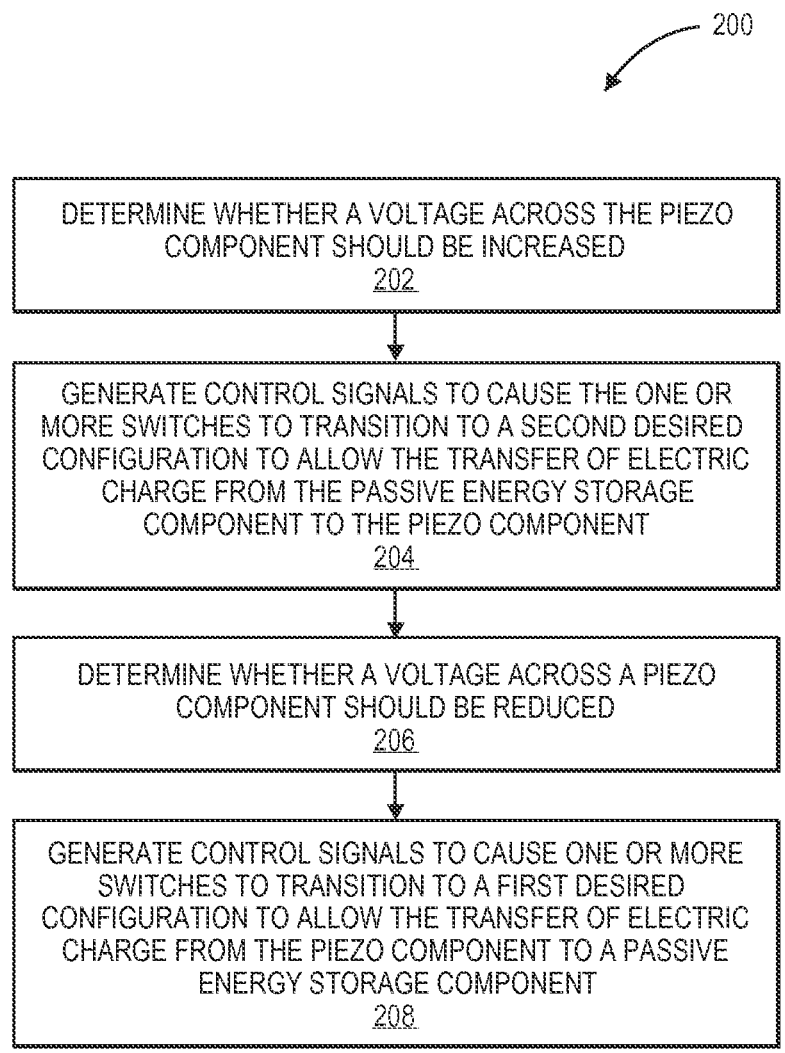
FIG. 2 is a flow diagram illustrating a method for at least partially recharging a storage energy component by way of a piezo component within a piezo driver, such as the piezo driver shown in FIGS. 1A and 1B, according to an example implementation of the present disclosure.

FIG. 2 illustrates a method 200 for at least partially recharging a storage energy component by way of a piezo component within a piezo driver according to an example implementation of the present disclosure. As shown in FIG. 2, a determination is made whether a voltage across a piezo component should be increased (Block 202). As described above, the control module 110 is configured to determine a second operational state of the piezo driver 100 by again comparing an input signal to a signal representing the voltage across the piezo component 102. Specifically, the control module 110, in another example implementation, is configured to determine whether the voltage across the piezo component 102 should be increased (i.e., drive the piezo component 102). When a determination that the voltage across the piezo component should be increased to drive the piezo component, a control signal is generated to cause one or more switches to transition to a desired configuration to allow the transfer of charge from the passive energy storage component to the passive energy storage component (Block 204). In an implementation, the control module 110 is configured to generate control signals (e.g., voltage values) to control the operation of the switches 136, 138, 140, 142 (e.g., transition from an open configuration to a closed configuration, or vice versa). For example, depending on the operational state as described in greater detail above, the control module 110 may cause the switches 136, 142 to transition to the closed configuration and cause the switches 138, 140 to transition to the open configuration, or vice versa. In this example, electric charge from the passive energy storage component 122 is transferred to the piezo component 102 by way of the voltage converter 128 to increase the absolute voltage value across the piezo component 102, which drives the piezo component 102.

As shown in FIG. 2, a determination is made whether a voltage across a piezo component should be reduced (Block 206). As described above, the control module 110 is configured to determine a first operational state of the piezo driver 100 by comparing an input signal to a signal representing the voltage across the piezo component 102. Specifically, the control module 110, in an example implementation, is configured to determine whether the voltage across the piezo component 102 should be decreased, or be reduced. For example, the voltage may be decreased across the piezo component 102 to return the piezo component 102 to its original state (e.g., non-driven state).

When a determination that the voltage across the piezo component should be reduced, a control signal is generated to cause one or more switches to transition to a desired configuration to allow the transfer of charge from the piezo component to a passive energy storage component (Block 208). In an implementation, the control module 110 is configured to generate control signals (e.g., voltage values) to control the operation of the switches 136, 138, 140, 142 (e.g., transition from an open configuration to a close configuration, or vice versa). Thus, the desired configuration may be the same configuration as the configuration described in Block 204. For example, depending on the operational state as described in greater detail above, the control module 110 causes the switches 136, 142 to transition to the closed configuration and causes the switches 138, 140 to transition to the open configuration, or vice versa. In this example, electric charge from piezo component 102 is transferred to the passive energy storage component 122 to at least partially recharge the passive energy storage component 122 by way of the voltage converter 128, which may allow for the re-use of the electric charge during the next operational state (e.g., re-use the electric charge to drive the piezo component 102).

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A piezo driver comprising:
a passive energy storage component configured to store electric charge;
a voltage converter configured to electrically connect between a piezo component and the passive energy storage component;
a first switch, a second switch, a third switch, and a fourth switch, the first switch, the second switch, the third switch, and the fourth switch each having an open configuration and a closed configuration, the first switch configured to electrically connect between the voltage converter and a first terminal of the piezo component, the second switch configured to electrically connect between a second terminal of the piezo component and ground potential, the third switch configured to electrically connect between ground potential and the first terminal of the piezo component, and the fourth switch configured to electrically connect between the voltage converter and the second terminal of the piezo component; and
a control module electrically connected to the first switch, the second switch, the third switch, and the fourth switch, the control module configured to cause the first switch, the second switch, the third switch, and the fourth switch to transition between the open configuration and the closed configuration, the control module configured to receive an input signal, the control module configured to determine a operational state of the piezo driver by comparing the input signal and a voltage value across the piezo component, and the operational state comprising a first state of operation, a second state of operation, a third state of operation, and a fourth state of operation, the first state of operation, the second state of operation, the third state of operation, and the fourth state of operation being different from each other,
wherein a positive voltage across the piezo component is generated during the first state of operation, a positive voltage across the piezo component is reduced during the second state of operation, a negative voltage across the piezo component is generated during the third state of operation, and a negative voltage across the piezo component is reduced during the fourth state of operation, and
wherein the voltage converter is configured to furnish electric charge from the passive energy storage component to the piezo component during the first and third states of operation and to furnish electric charge from the piezo component to the passive energy storage component during the second and fourth states of operation.

2. The piezo driver as recited in claim 1, wherein the passive energy storage component comprises a capacitor.

3. The piezo driver as recited in claim 1, further comprising a charge pump electrically connected to the passive energy storage component, the charge pump configured to generate an output voltage greater in value than an input voltage, the passive energy storage component configured to store an electric charge such that a voltage across the capacitor approximately equals the output voltage.

4. The piezo driver as recited in claim 1, wherein at least one of the first switch or the second switch comprise a metal-oxide-semiconductor field-effect transistor (MOSFET).

5. The piezo driver as recited in claim 4, wherein at least one of the first switch or the second switch comprise an n-type MOSFET.

6. The piezo driver as recited in claim 1, further comprising a feedback component configured to electrically connect in parallel with the piezo component and configured to electrically connect to the control module, the feedback component configured to measure the voltage value across the piezo component and furnish a signal representing the voltage value to the control module.

7. An electronic device comprising:
a piezo component;
a capacitor configured to store electric charge;
a voltage converter electrically connected between the piezo component and the capacitor;
a first switch, a second switch, a third switch, and a fourth switch, the first switch, the second switch, the third switch, and the fourth switch each having an open configuration and a closed configuration, the first switch configured to electrically connect between the voltage converter and a first terminal of the piezo component, the second switch configured to electrically connect between a second terminal of the piezo component and ground potential, the third switch configured to electrically connect between ground potential and the first terminal of the piezo component, and the fourth switch configured to electrically connect between the voltage converter and the second terminal of the piezo component; and a control module electrically connected to the first switch, the second switch, the third switch, and the fourth switch, the control module configured to cause the first switch, the second switch, the third switch, and the fourth switch to transition between the open configuration and the closed configuration, the control module configured to receive an input signal, the control module configured to determine a operational state of the electronic device by comparing the input signal and a voltage value across the piezo component, and the operational state comprising a first state of operation, a second state of operation, a third state of operation, and a fourth state of operation, the first state of operation, the second state of operation, the third state of operation, and the fourth state of operation being different from each other, wherein a positive voltage across the piezo component is generated during the first state of operation, a positive voltage across the piezo component is reduced during the second state of operation, a negative voltage across the piezo component is generated during the third state of operation, and a negative voltage across the piezo component is reduced during the fourth state of operation, and wherein the voltage converter is configured to furnish electric charge from the capacitor to the piezo component during the first and third states of operation and to furnish electric charge from the piezo component to the capacitor during the second and fourth states of operation.

8. The electronic device as recited in claim 7, further comprising a charge pump electrically connected to the capacitor, the charge pump configured to generate an output voltage greater in value than an input voltage, the capacitor configured to store an electric charge such that a voltage across the capacitor approximately equals the output voltage.

9. The electronic device as recited in claim 7, wherein at least one of the first switch or the second switch comprise a metal-oxide-semiconductor field-effect transistor (MOSFET).

10. The electronic device as recited in claim 9, wherein at least one of the first switch or the second switch comprise an n-type MOSFET.

11. The electronic device as recited in claim 7, further comprising a feedback component electrically connected in parallel with the piezo component and electrically connected to the control module, the feedback component configured to measure the voltage value across the piezo component and furnish a signal representing the voltage value to the control module.

12. A method comprising:
determining whether to generate a positive voltage across a piezo component by comparing an input signal received by a control module and a signal representing a voltage value across the piezo component;
generating a control signal to cause a first switch and a second switch to be in a closed configuration, and to cause a third switch, and a fourth switch to be in an open configuration to allow a transfer of electric charge from a passive energy storage component to the piezo component when the positive voltage across the piezo component is to be generated;
determining whether to reduce a positive voltage across the piezo component by comparing the input signal and the signal representing the voltage value across the piezo component;
generating a control signal to cause the first switch and the second switch to be in the closed configuration, and to cause the third switch, and the fourth switch to be in the open configuration to allow a transfer of electric charge from the piezo component to the passive energy storage component when the positive voltage across the piezo component is to be reduced;
determining whether to generate a posite voltage across the piezo component by comparing the input signal and the signal representing the voltage value across the piezo component;
generating a control signal to cause the third switch and the fourth switch to be in the closed configuration, and to cause the first switch, and the second switch to be in the open configuration to allow a transfer of electric charge from the passive energy storage component to the piezo component when the negative voltage across the piezo component is to be generated;
determining whether to reduce a negative voltage across the piezo component by comparing the input signal and the signal representing the voltage value across the piezo component; and
generating a control signal to cause the third switch and the fourth switch to be in the closed configuration, and to cause the first switch, and the second switch to be in the open configuration to allow a transfer of electric charge from the piezo component to the passive energy storage component when the negative voltage across the piezo component is to be reduced.

13. The method as recited in claim 12, wherein the one or more switches comprise metal-oxide-semiconductor field-effect transistors (MOSFETs).

14. The method as recited in claim 13, wherein the one or more switches comprise n-type MOSFETs.

15. The method as recited in claim 12, wherein the passive energy storage component comprises a capacitor.

16. The method as recited in claim 12, wherein the signal representing the voltage value across the piezo component is measured by a feedback component.

* * * * *